United States Patent
Chacin

(12) 
(10) Patent No.: US 6,344,631 B1
(45) Date of Patent: Feb. 5, 2002

(54) SUBSTRATE SUPPORT ASSEMBLY AND PROCESSING APPARATUS

(75) Inventor: Juan M. Chacin, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/854,990

(22) Filed: May 11, 2001

(51) Int. Cl.[7] .................................................. F27B 5/14
(52) U.S. Cl. ........................ 219/390; 219/405; 392/410; 118/724
(58) Field of Search ................................ 219/390, 405, 219/411; 118/724, 725, 501; 392/416, 418

(56) References Cited

U.S. PATENT DOCUMENTS

| | | | |
|---|---|---|---|
| 5,155,336 A | 10/1992 | Gronet et al. | 219/411 |
| 5,660,472 A | 8/1997 | Peuse et al. | 374/128 |
| 5,755,511 A | 5/1998 | Peuse et al. | 374/128 |
| 5,790,750 A | 8/1998 | Anderson | 392/416 |
| 5,960,159 A | 9/1999 | Ikeda et al. | 392/418 |
| 5,960,555 A | 10/1999 | Deaton et al. | 34/58 |
| 6,035,100 A | 3/2000 | Bierman et al. | 392/416 |
| 6,048,403 A * | 4/2000 | Deaton et al. | 118/725 |
| 6,113,703 A | 9/2000 | Anderson et al. | 118/725 |
| 6,121,581 A * | 9/2000 | Hegedus | 219/390 |
| 6,123,766 A | 9/2000 | Williams et al. | 117/85 |
| 6,133,152 A | 10/2000 | Bierman et al. | 438/706 |
| 6,151,446 A * | 11/2000 | Hunter et al. | 392/416 |
| 6,151,447 A | 11/2000 | Moore et al. | 392/418 |
| 6,157,106 A | 12/2000 | Tietz et al. | 310/90.5 |
| 6,170,433 B1 * | 1/2001 | Du Bois | 118/725 |
| 6,197,118 B1 | 3/2001 | Sakai | 118/715 |
| 6,333,991 * | 4/2001 | Davenport | 392/418 |

FOREIGN PATENT DOCUMENTS

WO  WO 99/23690  5/1999

* cited by examiner

Primary Examiner—Teresa Walberg
Assistant Examiner—Shawntina T. Fuqua
(74) Attorney, Agent, or Firm—Blakely, Sokoloff, Taylor & Zafman

(57) ABSTRACT

A substrate processing assembly includes an edge support and a heat distributing plate to absorb and transfer heat energy via radiation from a radiant heat source to a substrate on the edge support. The edge support defines a substrate support location to support a substrate at an edge of the substrate during processing. The assembly further includes a first heat distributing plate positioned generally parallel to the edge support. A plurality of edge support holding arms is coupled to the edge support. The plurality of edge support holding arms is also coupled to the first heat distributing plate to hold the first heat distributing plate spaced apart from the edge support. In another embodiment, the assembly can include a second heat distributing plate spaced apart from the edge support. In yet another embodiment, the substrate processing assembly can be used in a substrate processing apparatus that includes a chamber within which the assembly is located and a radiant heat source to provide radiant heat to the chamber. The structure of the processing assembly provides substrate processing assembly components that have a low thermal mass such that the temperature of the chamber can be quickly ramped up to operating temperature, thus significantly decreasing the time to process a substrate such as a semiconductor wafer.

30 Claims, 5 Drawing Sheets

SUBSTRATE SUPPORT ASSEMBLY AND PROCESSING APPARATUS

FIELD OF THE INVENTION

The present invention relates generally to processing chambers for processes such as chemical vapor deposition of thin films onto substrates and, more particularly, to low mass substrate support assemblies for use in thin film deposition and rapid thermal processing chambers.

BACKGROUND

Thermal processes such as deposition of thin films onto substrates have many applications. One example of such an application is the processing of silicon substrates for the manufacture of integrated circuits. An important part of integrated circuit manufacturing is processing of the semiconductor substrate in which active devices such as transistors and capacitors that comprise the integrated circuit are formed. Any one of a number of processing steps may be carried out including deposition of a layer of material onto the wafer, etching a layer of material that is formed on the wafer or causing chemical reactions or temperature-enhanced mass transport within material formed on the wafer. Examples of materials that can be deposited during such processing include epitaxial silicon or polycrystalline silicon, or a thermal oxide or thermal nitride layer over silicon, and the like.

Processing chambers in which these processes can be performed typically include a platform such as a susceptor or an edge ring, a substrate support mechanism, a quartz housing or cover, and an array of lamps that provide radiant heat energy to the interior of the chamber and the substrate being processed. One or more of these processing steps may be carried out in a chemical vapor deposition processing chamber such as the processing chamber 100 shown in FIG. 1A. A wafer 102 is inserted through an opening (not shown) into the processing chamber 100 and located on a susceptor 104. Upper heat lamps 106 are generally used to radiate infrared light through an upper dome 108 of the processing chamber 100 onto the wafer 102. Lower heat lamps 107 may also be used to radiate infrared light through a lower dome 109 of the processing chamber 100 onto the susceptor 102. Upper dome 108 and lower dome 109 are typically made of quartz. One or more gasses are then introduced into the processing chamber 100. These gasses then carry out one or more of the processing steps, as previously discussed, with the wafer 102 being maintained at a required processing temperature.

By controlling power supplied to the heat lamps 106 and 107 the wafer 102 can be maintained at a required processing temperature. FIG. 1B is a top view of one example of an annular array 105 of upper heat lamps 106 that can be used with chamber 100.

FIG. 2 shows a top view of an example of another processing chamber 200 in which the substrate or wafer rests on an edge ring (not shown) rather than a susceptor. The edge ring supports the wafer circumferentially at the wafer's edge. The edge ring (shown in FIG. 3) defines a central opening such that the bottom surface of the substrate is exposed to radiant heat from heat lamps positioned below the edge ring. The top surface of the wafer is exposed to an radiant heat of an array of upper heat lamps (not shown). In this type of chamber, the heat lamps are typically provided in an array referred to as a "honeycomb" array. FIG. 2 shows a top view of an example of a honeycomb array. The honeycomb array of lamps is particularly suited to a chamber that uses an edge ring rather than a susceptor as the substrate support because the heating pattern produced by the honeycomb array is generally more controllable over the entire surface of the wafer as compared to the annular array of lamps. The honeycomb array, however, has a relatively large number of lamps, which can be relatively expensive to achieve an acceptable level of reliability. An annular array of lamps is typically more suited for use in a chamber having a susceptor as the wafer support because the susceptor provides a better distribution of heat to the substrate via conduction even though the heating pattern of the annular array may be somewhat uneven. The annular array has relatively fewer lamps compared to the honeycomb array.

Many tppes of thin film deposition chambers or reactors use silicon carbidecoated, graphite susceptors to hold the substrate or wafer during the deposition process. In addition to providing mechanical support for the wafer, the susceptor also absorbs and distributes the energy from the heating lamps to achieve a more uniform temperature distribution over the entire surface of the wafer resting on the susceptor during processing. A consequence of this design is that the reactor must provide enough energy to heat up not only the wafer but also the susceptor, which has a thermal mass several times larger than that of the wafer itself. Consequently, chamber throughput is limited as a significant fraction of the overall process time is spent heating up and cooling down the reactor between consecutive wafers. For this reason, and since the susceptor's diameter is fixed by the size of the wafers being processed, the trend over the years has been to decrease the thickness of the susceptor as much as current manufacturing techniques will allow.

There are, however, at least two major problems associated with this approach to reducing the susceptor's thermal mass. First, as susceptors become thinner, they inevitably lose mechanical strength, which makes them prone to deformation and even breakage. Even though manufacturers have proven adept at continuously improving their manufacturing capabilities for thinner susceptors, there are indications that it is becoming increasingly difficult for them to continue this trend. The second issue is that, with a reduced cross sectional area available for heat conduction, thinner susceptors have a diminished capacity to redistribute lamp heat, resulting in the possibility of uneven heating due to the heating pattern of the lamp array, especially in the case of an annular lamp array such as the type shown in FIG. 1B.

SUMMARY

In one embodiment, a substrate processing assembly includes an edge support defining a substrate support location to support a substrate at an edge of the substrate during processing. The assembly further includes a first beat distributing plate positioned generally parallel to the edge support. A plurality of edge support holding arms is coupled to the edge support. The plurality of edge support holding arms is also coupled to the first heat distributing plate to hold the first heat distributing plate spaced apart from the edge support. In another embodiment, the assembly can include a second heat distributing plate spaced apart from the edge support. In yet another embodiment, the substrate processing assembly can be used in a substrate processing apparatus that includes a chamber within which the assembly is located and a radiant heat source to provide radiant heat to the chamber.

BRIEF DESCRIPTION OF THE DRAWINGS

The present invention is illustrated by way of example, and not limitation, in figures of the accompanying drawings in which.

DETAILED DESCRIPTION

In the various embodiments of a substrate processing assembly and apparatus described herein, at least one heat distributing plate is positioned adjacent an edge support such that heat energy from a radiant heat source is redistributed by radiation from the heat distributing plate to the substrate to provide a relatively even heating pattern to the substrate being processed. The heat distributing plate and the radiant redistribution of heat energy replaces the susceptor and conductive redistribution of heat energy in processing chambers such as chemical vapor deposition chambers and the like. The structure of the processing assembly described herein provides substrate processing assembly components that have a low thermal mass such that the temperature of the chamber can be quickly ramped up to operating temperature, thus significantly decreasing the time to process a substrate such as a semiconductor wafer.

In one embodiment, a substrate processing assembly includes an edge support defining a substrate support location to support a substrate at an edge of the substrate during processing. An example of an edge support is an edge ring that defines a recess or pocket defining the substrate support location. A first heat distributing plate is positioned generally parallel to the edge support. In one embodiment, the first heat distributing plate is positioned below the edge support and between the edge support and a radiant heat source such as a lamp array. In another embodiment, a first heat distribution plate is positioned above the edge support and is used in a chamber having a radiant heat source above the edge support. It is contemplated that a heat distribution plate can be provided above or below the edge support, or two heat distribution plates can be provided above and below the edge support. A plurality of edge support holding arms is coupled to the edge support. The edge support holding arms are also coupled to the first heat distributing plate. The first heat distributing plate is held spaced apart from the edge support.

In one embodiment, the substrate processing assembly described above is used in a substrate processing apparatus that includes a chamber and a radiant heat source that provides radiant heat to the chamber. In one embodiment, the radiant heat source is an annular array of lamps. In another embodiment, the radiant heat source can be an array of lamps positioned in a honeycomb pattern.

In operation, the radiant heat source provides radiant heat to the heat distributing plate, which in turn absorbs the radiant heat energy and redistributes the heat energy to the substrate. Thus, a radiant heat source such as a lamp array that may have a relatively uneven heating pattern can be used with an edge support whereas normally, such a lamp array necessitates the use of a susceptor to redistribute the heat energy by conduction such that the substrate being processed receives a relatively even heating pattern over its entire surface.

Figure 4:
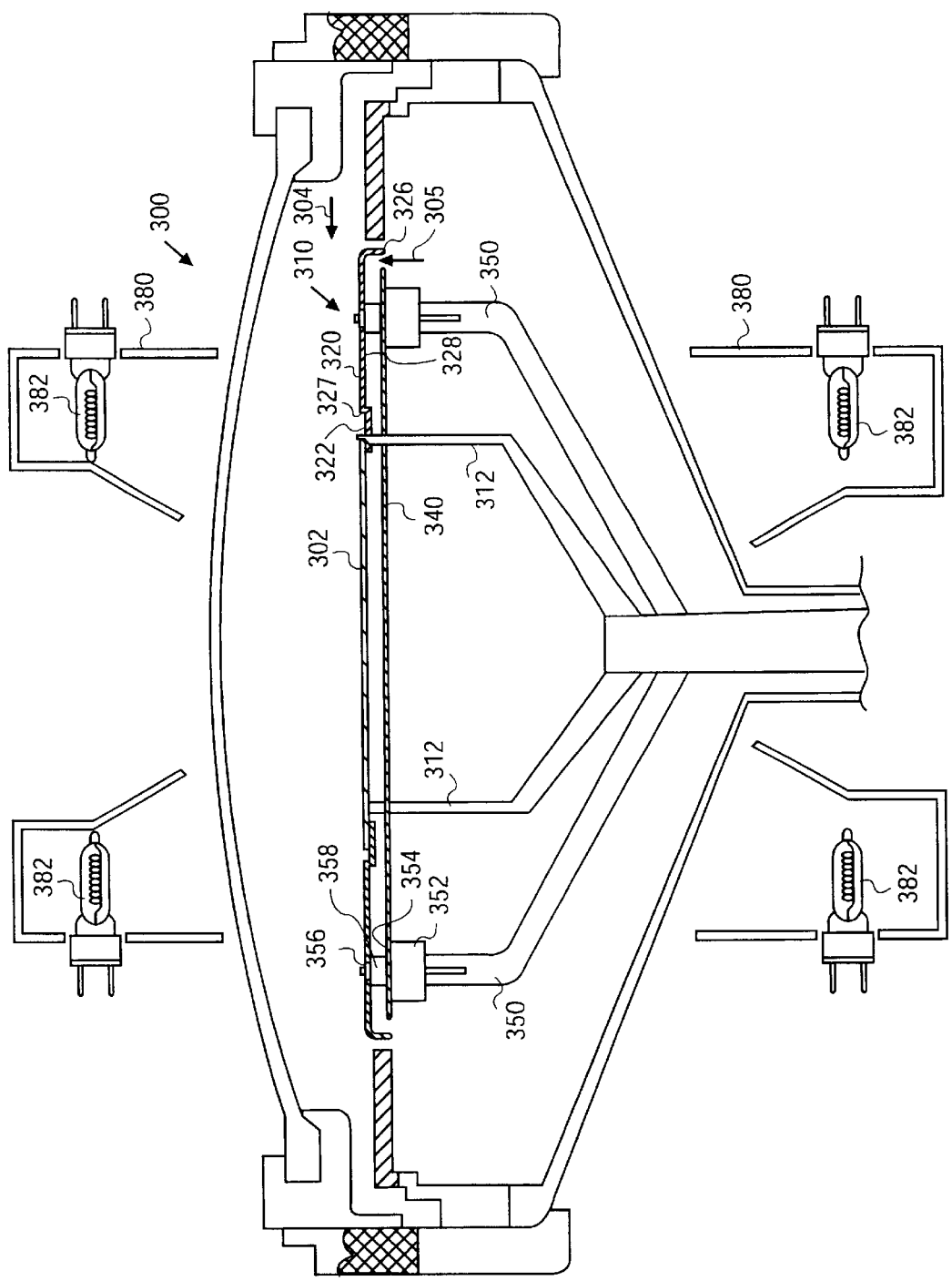
FIG. 4 is a cross sectional view of one embodiment of a substrate processing chamber including an edge ring and a heat distributing plate.

FIG. 4 shows a processing chamber 300 in one embodiment of the present invention. A substrate 302 is shown in the processing chamber 300. Within the chamber 300 is a substrate processing assembly 310. Substrate processing assembly 310 includes an edge support 320, a first heat distributing plate 340, and a plurality of edge support holding arms 360.

Edge support 320 defines a substrate support location 322 to support substrate 302 at its edge. For purposes of description herein, edge support 320 is described as an edge ring that has a circular shape designed to support the generally circular wafers commonly used in the manufacture of integrated circuits. It is contemplated that edge supports having non-circular shapes can also embody the present invention.

Figure 1A:
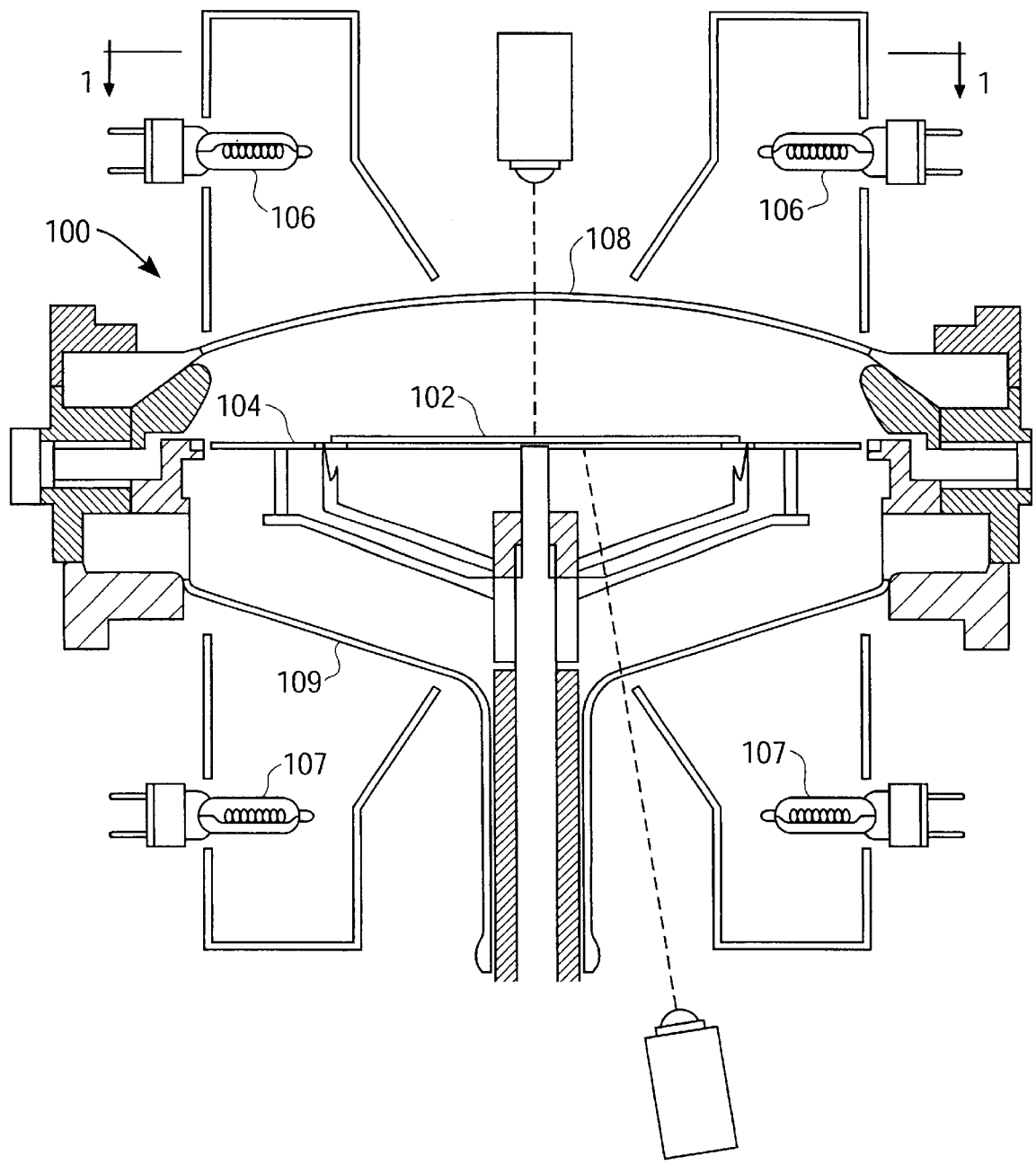
FIG. 1A is a cross sectional view of a prior art substrate processing chamber.
Figure 1B:
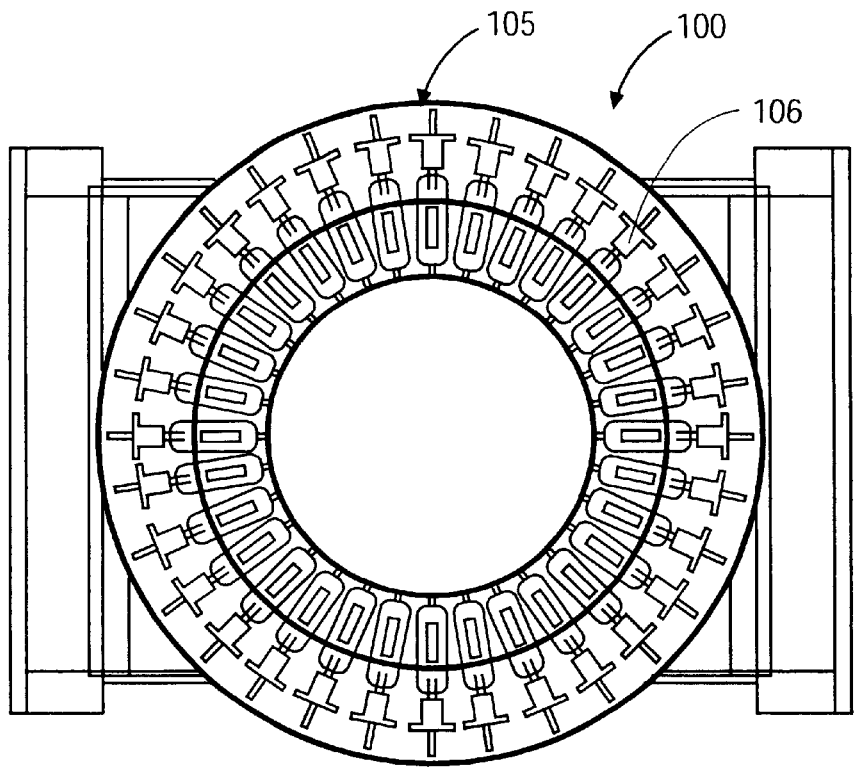
FIG. 1B is a top view of a prior art annular lamp array taken along line 1—1 of FIG. 1A.
Figure 2:
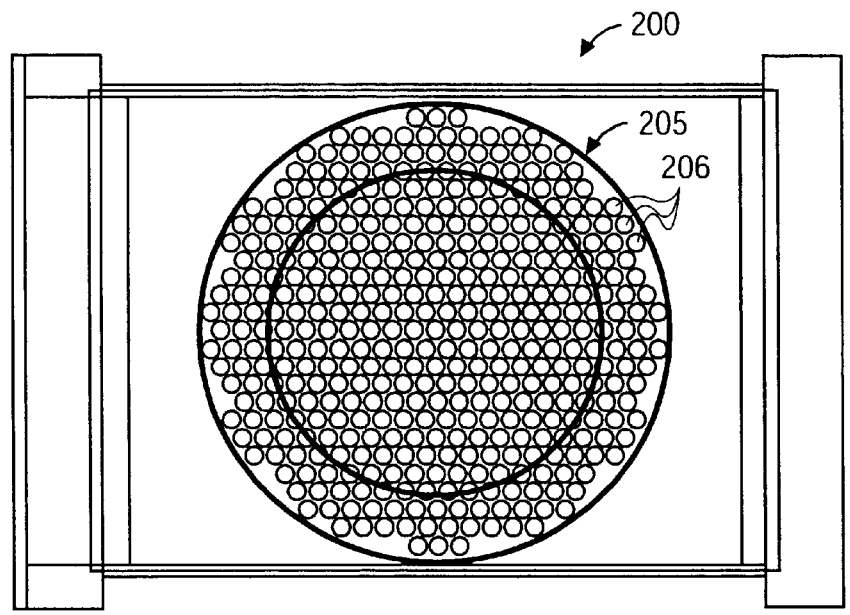
FIG. 2 is a top view of a honeycomb lamp array.
Figure 3:
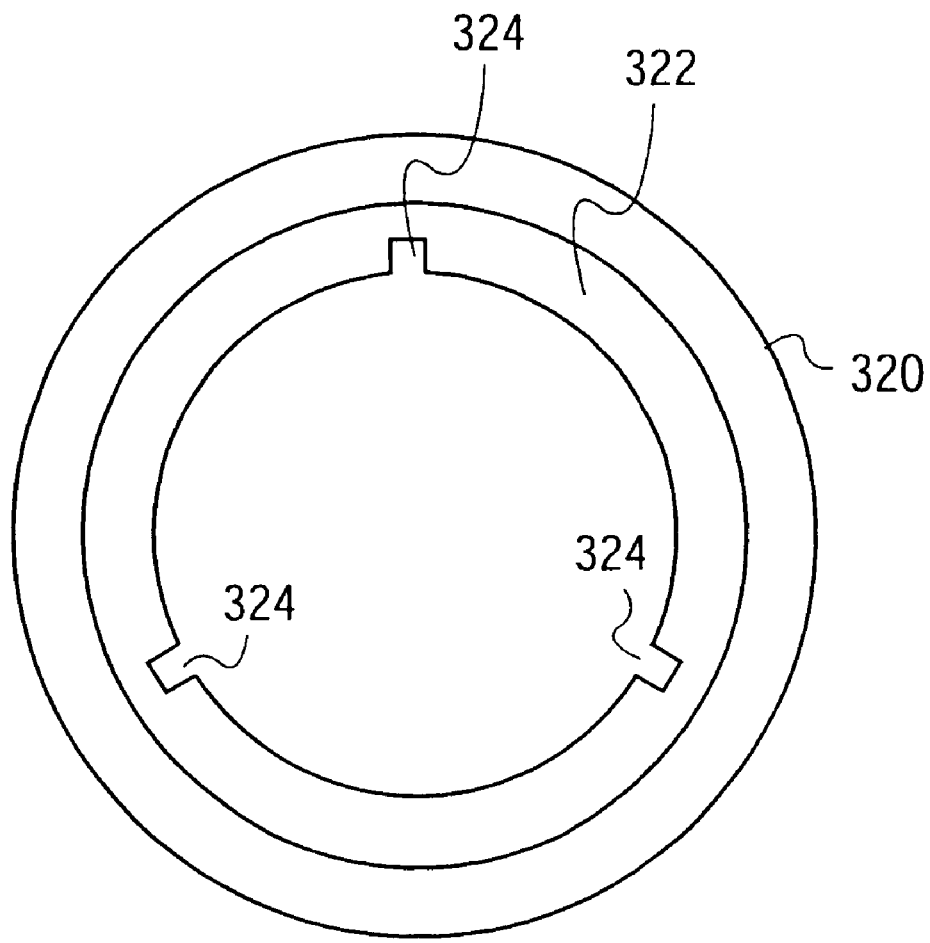
FIG. 3 is a top view of an embodiment of an edge support in the form of an edge ring.

Referring again to FIG. 3, edge support 320 is an annular body that defines a substrate support location 322. In one embodiment, substrate support location 322 is an annular recess or pocket. Openings 324 are defined at equal circumferential intervals near the inner circumference of the edge support 320. Openings 324 are provided so that lift arms 312 (FIG. 4) can extend the through the openings 324 to lift the substrate off the edge support 320. In another embodiment, edge support 320 need not have openings for lift arms. For example, lift arms for 200 mm wafers can be located about 10 mm inboard of the wafer's edge. For larger wafers, such as 300 mm wafers, the edge support may have a larger diameter such that the lift arms would not extend through the substrate support location, but would be located inward of the edge support. Thus, the edge support would not need such openings as shown in FIG. 3.

Referring again to FIG. 4, edge support 320 further includes a downwardly extending skirt 326. Skirt 326 extends around the circumference of the edge support 320 in the embodiment shown in FIG. 4, but may be positioned inwardly from the outermost circumference of edge support 320. Skirt 326 is provided to keep process gases that are pumped into the interior of the chamber (as illustrated by arrow 304) from reaching the back side of the substrate 302. A purge gas such as a hydrogen can be directed across the back side of the substrate 302 as illustrated by arrow 305. The purge gas can be directed through the space between the skirt 326 and the edge of the first reflecting plate 340. In the embodiment shown in FIG. 4, the process gases are provided across the top side of the substrate 302 to deposit material on the top side of the substrate.

In one embodiment, the edge support 320 can be made of machined silicon carbide, which has been found to be successfully manufactured for certain applications at thicknesses as up to 10 times less than that of conventional graphite susceptors. A nitrogen-doped silicon carbide alloy can also be used. The added nitrogen in such an alloy can make the material opaque to infrared light. Therefore, the material can be made thinner before it becomes transparent.

In one embodiment, edge support 320 has a wall thickness of approximately 0.025 inch, and the thickness can be in the range of about 0.010 inch to about 0.035 inch. The edge support 320, when in the form of an edge ring, can be designed to accommodate semiconductor substrates or wafers of any size, such as 200 mm diameter or 300 mm diameter wafers.

As shown in FIG. 4, the first heat distributing plate 340 is positioned generally parallel to the edge support 320, i.e., generally parallel to a plane defined by a top or bottom surface of the edge support 320. In one embodiment, edge support 320 has a top side 327 and a bottom side 328, and the first heat distributing plate 340 is positioned adjacent the bottom side 328.

The first heat distributing plate can be made of machined silicon carbide or a nitrogen-doped silicon carbide alloy. The first heat distributing plate 340 can have a thickness in the range of about 0.254 mm (0.010 inch) to about 0.635 mm (0.025 inch). The heat distributing plate serves as a heat radiation surface to redistribute the heat energy provided to the chamber by radiant heat sources as described in further detail below. Thus, a more uniform temperature distribution on the substrate can be achieved. Also, the heat distributing plate can serve as a target for the temperature measuring devices that are used to control the system. This is particularly useful during chamber cleaning processes when there is no substrate present within the chamber.

As shown in FIG. 4, the first heat distributing plate 340 and the edge support 320 are held in a spaced apart relationship by the edge support holding arms 350. The plurality of edge support holding arms are coupled to the edge support 320 and to the first heat distributing plate 340. In one embodiment, the edge support holding arms 350 each include an end portion 352. Each end portion 352 can be an integral or unitary part of each respective edge support holding arm 350, or the end portions 352 can be made as separate pieces attached to edge support holding arms 350.

Each end portion 352 has a first shoulder 354 and a second shoulder 356. In the embodiment shown in FIG. 4, the first heat distributing plate 340 is coupled to each first shoulder 354 and the edge support is coupled to each second shoulder 356. The first heat distributing plate 340 and the edge support 320 can be coupled to the respective first and second shoulders by resting on the shoulders or being physically attached to the shoulders. The end portion 352 of each edge support holding arm 350 also includes a spacer 358. Spacer 358 can be designed to have a selected height in order to maintained a particular distance between and the first heat distributing plate 340 and the edge support 320.

In one embodiment, the first heat distributing plate 340 is spaced less that about 4 mm from the edge support 320. In another embodiment, the first heat distributing plate is spaced more than about 1 mm from the edge support. The range of about 1 mm to about 4 mm is contemplated (with the range of about 2 mm to about 3 mm being preferred) to provide enough of a space such that heat energy is transferred to the substrate primarily by radiation rather than by convection through the purge gas between the substrate and the first heat distributing plate or by conduction as in the case of a susceptor. The more heat that can be transferred as radiation, the less sensitive the assembly will be to lateral heat conduction losses and to lack of perfect flatness of the thin parts such as the edge support and the heat distributing plate.

As shown in FIG. 4, an embodiment of the substrate processing apparatus can include chamber 300 and at least one radiant heat source 380 to provide heat energy to the chamber 300. Each radiant heat source 380 shown in FIG. 4 is an annular array of lamps 382. In one embodiment, a radiant heat source 380 is positioned below the chamber 300 such that the first heat distributing plate 340 is positioned between the radiant heat source 380 and the bottom side 328 of the edge support 320.

Figure 5:
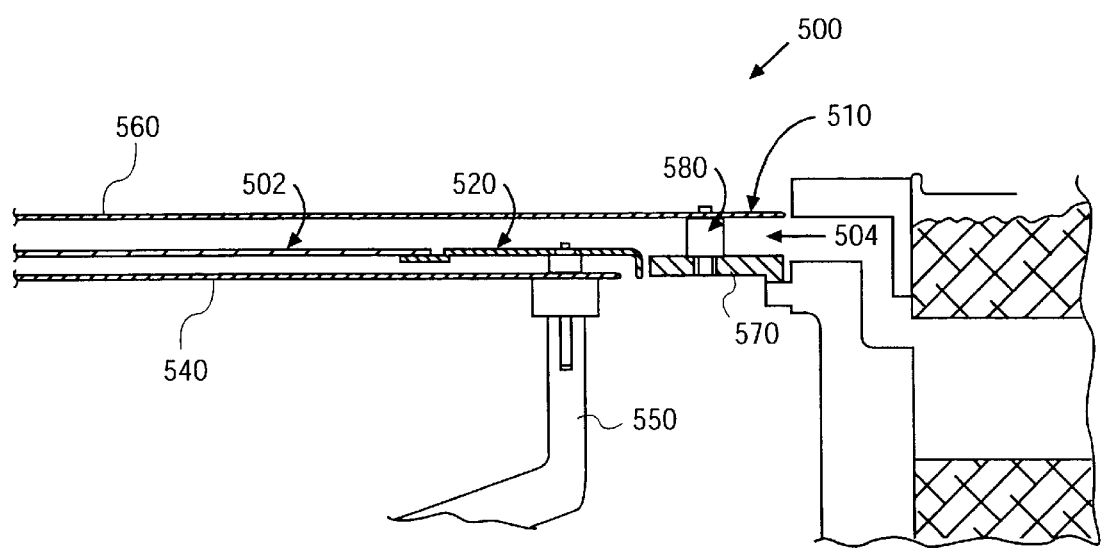
FIG. 5 is an enlarged partial cross sectional view of another embodiment of a substrate processing assembly including first and second heat distributing plates.

FIG. 5 shows a processing chamber 500 having a substrate processing assembly 510. Substrate processing assembly 510 includes an edge support 520, a first heat distributing plate 540, a plurality of edge support holding arms 550, a second heat distributing plate 560, a preheat platform 570, and a support pin 580. The edge support 520, first heat distributing plate 540, and edge support holding arms 550 can be similar to previously described embodiments. In addition to these components, the embodiment illustrated in FIG. 5 includes the second heat distributing plate 560 generally parallel to and spaced apart from the edge support 520 and adjacent the top side of the edge support 520. The second heat distributing plate 560 can be positioned between about 1 mm and about 4 mm from the edge support 520, and preferably between about 2 mm and about 3 mm.

The preheat platform 580 is generally coplanar with and surrounds the edge support 520. The second heat distributing plate 560 is coupled to the preheat platform 570 by a support pin 580. The support pin 580 has a central portion that is dimensioned to provide a space between the second heat distributing plate 560 and the substrate 502 on the edge support 520. The process gases are pumped into the space between the second heat distributing plate 560 and the substrate 502 in the direction of the arrow 504. In the exemplary process of silicon deposition, the growth rate of silicon film at high temperature increases with increasing gas velocity. This structure can be optimized for this effect by adjusting the distance between the wafer or substrate and the second heat distributing plate 560. This configuration can also reduce the time required to etch or clean the chamber after silicon deposition because the second heat distributing plate 560 can be heated to temperatures in excess of 1150 degrees Celsius. The confinement of the process gases to the space between the second heat distributing plate 568 and the substrate 502 also minimizes silicon film deposition on the upper quartz dome (not shown) of the chamber.

What is claimed is:

1. A substrate processing assembly comprising:
   an edge support defining a substrate support location to support a substrate at an edge of the substrate during processing;
   a first heat distributing plate positioned generally parallel to the edge support; and
   a plurality of edge support holding arms coupled to the edge support, the plurality of edge support holding arms also coupled to the first heat distributing plate to hold the first heat distributing plate spaced apart from the edge support.

2. The substrate processing assembly of claim 1 wherein each of the edge support holding arms includes an end portion having a first shoulder and a second shoulder, and wherein the first heat distributing plate is coupled to the first shoulders and the edge support is coupled to the second shoulders.

3. The substrate processing assembly of claim 1 wherein the first heat distributing plate is spaced less than about 4 millimeters from the edge support.

4. The substrate processing assembly of claim 3 wherein the first heat distributing plate is spaced more than about 1 millimeter from the edge support.

5. The substrate processing assembly of claim 1 wherein the edge support has a top side and a bottom side and the first heat distributing plate is positioned adjacent the bottom side.

6. The substrate processing assembly of claim 5 wherein a second heat distributing plate is positioned generally parallel to and spaced apart from the edge support and adjacent the top side of the edge support.

7. The substrate processing assembly of claim 6 wherein the second heat distributing plate is spaced less than about 4 millimeters from the edge support.

8. The substrate processing assembly of claim 7 wherein the second heat distributing plate is spaced more than about 1 millimeter from the edge support.

9. The substrate processing assembly of claim 5 further comprising a preheat platform generally coplanar with and surrounding the edge support, wherein the second heat distributing plate is coupled to the preheat platform.

10. The substrate processing assembly of claim 1 wherein the edge support is an edge ring having an annular recess that defines the substrate support location.

11. A substrate processing apparatus comprising:
   a chamber;
   a radiant heat source to provide heat energy to the chamber;
   an edge support in the chamber, the edge support defining a substrate support location to support a substrate at an edge of the substrate during processing;
   a first heat distributing plate between the edge support and the radiant heat source, the first heat distributing plate to absorb the heat energy from the radiant heat source and to transfer the heat energy by radiation toward the edge support; and
   a plurality of edge support holding arms coupled to the edge support, the plurality of edge support holding arms also coupled to the first heat distributing plate to hold the first heat distributing plate spaced apart from the edge support.

12. The substrate processing apparatus of claim 11 wherein each of the edge support holding arms includes an end portion having a first shoulder and a second shoulder, and wherein the first heat distributing plate is coupled to the first shoulders and the edge support is coupled to the second shoulders.

13. The substrate processing apparatus of claim 11 wherein the first heat distributing plate is spaced less than about 4 millimeters from the edge support.

14. The substrate processing apparatus of claim 13 wherein the first heat distributing plate is spaced more than about 1 millimeter from the edge support.

15. The substrate processing apparatus of claim 11 wherein the edge support has a top side and a bottom side and the first heat distributing plate is positioned adjacent the bottom side.

16. The substrate processing apparatus of claim 15 wherein a second heat distributing plate is positioned generally parallel to and spaced apart from the edge support and adjacent the top side of the edge support.

17. The substrate processing apparatus of claim 16 wherein the second heat distributing plate is spaced less than about 4 millimeters from the edge support.

18. The substrate processing apparatus of claim 17 wherein the second heat distributing plate is spaced more than about 1 millimeter from the edge support.

19. The substrate processing apparatus of claim 15 further comprising a preheat platform generally coplanar with and surrounding the edge support, wherein the second heat distributing plate is coupled to the preheat platform.

20. The substrate processing apparatus of claim 11 wherein the edge support is an edge ring having an annular recess that defines the substrate support location.

21. The substrate processing apparatus of claim 11 wherein the radiant heat source is an annular array of lamps.

22. A substrate processing apparatus comprising:
   a chamber;
   an edge ring in the chamber, the edge ring defining a substrate support location to support a substrate at an edge of the substrate during processing, the edge ring having a top side and a bottom side, the substrate support location being defined on the top side;
   an annular array of lamps to provide heat energy to the chamber, the array of lamps positioned below the edge ring;
   a first heat distributing plate positioned adjacent the bottom side of the edge ring and between the edge ring and the annular array of lamps; and
   a plurality of edge ring support arms coupled to the edge ring to support the edge ring within the chamber, the plurality of edge ring support arms also coupled to the first heat distributing plate to support the first heat distributing plate spaced apart from the edge ring.

23. The substrate processing apparatus of claim 22 wherein each of the edge ring support arms includes. an end portion having a first shoulder and a second shoulder, and wherein the first heat distributing plate is coupled to the first shoulders and the edge ring is coupled to the second shoulders.

24. The substrate processing apparatus of claim 22 wherein the first heat distributing plate is spaced less than about 4 millimeters from the edge ring.

25. The substrate processing apparatus of claim 24 wherein the first heat distributing plate is spaced more than about 1 millimeter from the edge ring.

26. The substrate processing apparatus of claim 22 wherein a second heat distributing plate is positioned generally parallel to and spaced apart from the edge ring and adjacent the top side of the edge ring.

27. The substrate processing apparatus of claim 26 wherein the second heat distributing plate is spaced less than about 4 millimeters from the edge ring.

28. The substrate processing apparatus of claim 27 wherein the second heat distributing plate is spaced more than about 1 millimeter from the edge ring.

29. Tie substrate processing apparatus of claim 22 further comprising a preheat ring surrounding the edge ring, wherein the second heat distributing plate is coupled to the preheat ring.

30. The substrate processing apparatus of claim 22 wherein the edge ring defines an annular recess that defines the substrate support location.

* * * * *